United States Patent [19]

Brown

[11] 4,035,784
[45] July 12, 1977

[54] ASYMMETRICAL MEMORY CELL ARRANGEMENT

[75] Inventor: George W. Brown, San Jose, Calif.

[73] Assignee: Fairchild Camera and Instrument Corporation, Mountain View, Calif.

[21] Appl. No.: 642,956

[22] Filed: Dec. 22, 1975

[51] Int. Cl.² .................................. G11C 11/40
[52] U.S. Cl. ........................ 340/173 R; 340/173 FF; 307/238
[58] Field of Search .............. 340/173 R, 173 FF; 307/238, 279

[56] References Cited
U.S. PATENT DOCUMENTS 3,801,967  4/1974  Berger .................... 340/173 LI Primary Examiner—Terrell W. Fears
Attorney, Agent, or Firm—Alan H. MacPherson; Henry K. Woodward; Norman E. Reitz

[57] ABSTRACT

A memory cell is provided which comprises a word line, a current source line, a pair of bit lines, a first transistor having a base terminal, a collector terminal coupled to the word line, a first emitter coupled to a first of the pair of bit lines, a second emitter coupled to the current source line, a second transistor having a base terminal coupled to the collector terminal of the first transistor, a collector terminal coupled to the word line and to the base of the first transistor, a first emitter coupled to a second of the pair of bit lines, and a second emitter coupled to the current source line, and means for directing more current through the second transistor than through the first transistor.

7 Claims, 5 Drawing Figures

ASYMMETRICAL MEMORY CELL ARRANGEMENT

BACKGROUND OF THE INVENTION

1. Field of the Invention

This invention relates generally to memory arrays, and in particular to a semiconductor memory array comprising asymmetrical bistable memory cells that can be established in a predetermined state.

2. Prior Art

In the past each cell in an array of memory cells had to be addressed to erase the information previously stored in the array when it was necessary to begin operations with a clean slate or a programmed pattern of information. This technique, of course, required a considerable amount of time in comparison to the speed of operation of computing devices and the like.

More recently, prior art resettable memory arrays have been disclosed in U.S. Pat. No. 3,643,833 entitled "Associative Memory Circuit," which issued to Roger S. Dunn on Jan. 11, 1972; and, U.S. Pat. No. 3,798,621 entitled "Monolithic Storage Arrangement with Latent Bit Pattern," which issued to Utz Baitinger, Knut Najmann and Rolf Remshardt on Mar. 19, 1974. Each of these prior art memory devices have a disadvantage in that each requires an extra line or set of lines to reset the memory array or program a latent bit pattern.

SUMMARY OF THE INVENTION

In accordance with the present invention, a memory cell is provided which comprises a word line, a current source line, a pair of bit lines, a first transistor having a base terminal, a collector terminal coupled to the word line, a first emitter coupled to a first of the pair of bit lines, a second emitter coupled to the current source line, a second transistor having a base terminal coupled to the collector terminal of the first transistor, a collector terminal coupled to the word line and to the base of the first transistor, a first emitter coupled to a second of the pair of bit lines, and a second emitter coupled to the current source line, and means for directing more current through the second transistor than through the first transistor.

DETAILED DESCRIPTION

A plurality of asymmetrical memory cells of the present invention are arranged in an array forming columns of bits and rows of words where each cell is disposed for storing and retrieving binary information. Each cell is comprised of a multivibrator circuit coupled to a pair of bit lines, which are used as means for both storing information into and retrieving information from the memory cells. Each pair of bit lines is coupled to a column of memory cells and to sense amplifiers. Power is independently supplied to each row of memory cells, which also effects addressing of the memory cells in a given row of cells. Each memory cell in the array further includes means for resetting or setting the cells to a predetermined state in response to an interruption of the cell sustaining current.

Figure 1:
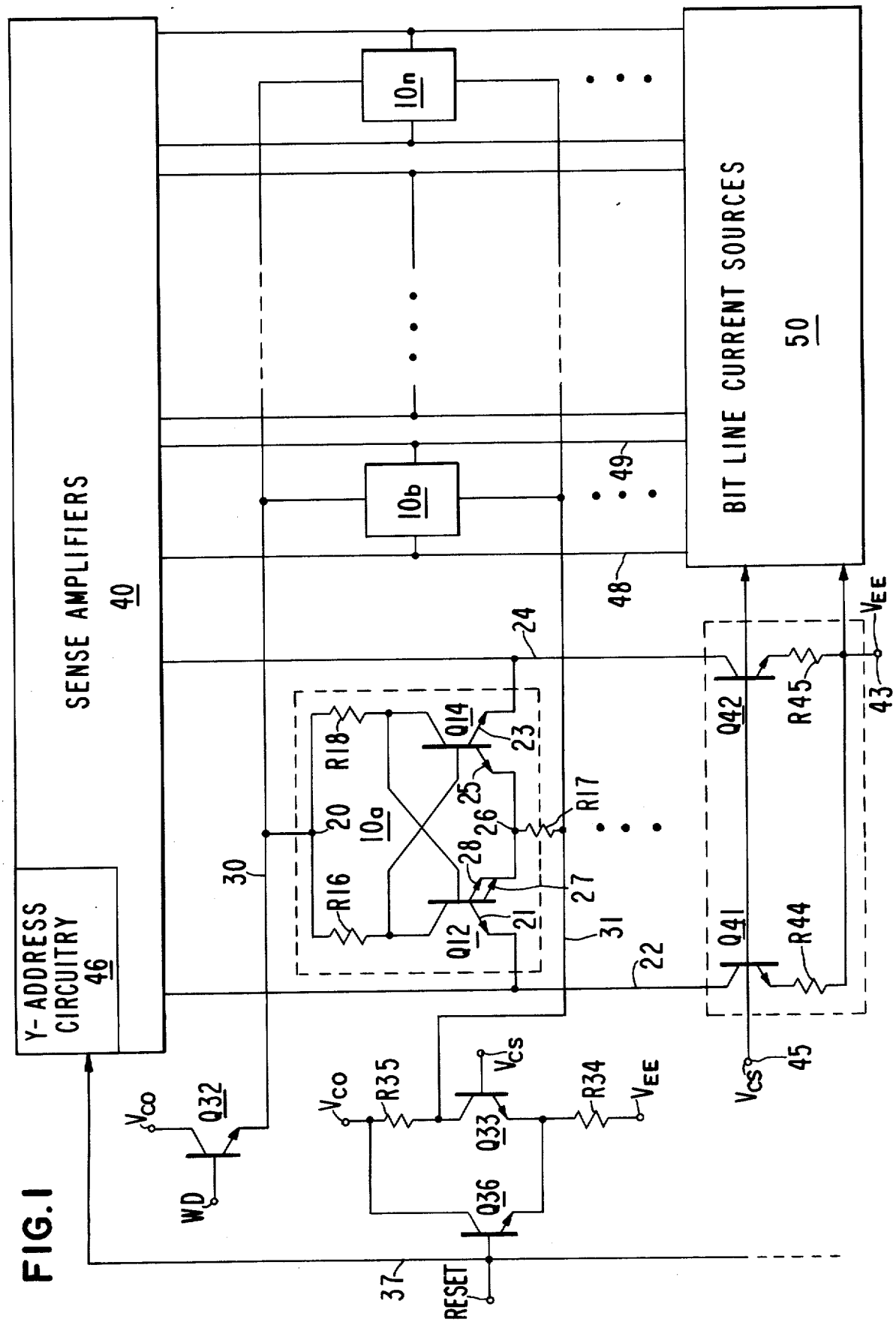
FIG. 1 is a schematic-block diagram of a portion of a memory array, including details of a typical memory cell and reset circuitry of the present invention.

Referring now to FIG. 1, a block-schematic diagram is shown of a portion of a memory array employing a multiplicity of asymmetrical memory cells 10 constructed in accordance with the present invention. A typical memory cell 10a is formed from a cross-coupled pair of multiple emitter transistors Q12 and Q14. That is, the base terminal of the transistor Q12 is coupled to the collector terminal of the transistor Q14, and the base terminal of the transistor Q14 is coupled to the collector terminal of the transistor Q12. Resistors R16 and R18 are coupled between the collector terminals of the transistors Q12 and Q14 respectively, and to a circuit point 20.

A first emitter 21 of the transistor Q12 is coupled to a bit line 22. In a similar manner, a first emitter 23 of the transistor Q14 is coupled to a bit line 24. A second emitter 25 of the transistor Q14 is coupled to a circuit point 26. A pair of emitters 27 and 28 of the transistor Q12 are also coupled to the circuit point 26. It is pointed out, however, that emitters 27 and 28 of the transistor Q12 may be integrated into a single large emitter, which is greater in area than the integrated emitter 25 of the transistor Q14.

Circuit point 20 is coupled to a word line 20, and circuit point 26 is coupled to a word driver current source line 31 through a resistor R17. Word line 30 is coupled to the emitter of a word driver transistor Q32. The base terminal of the transistor Q32 is coupled to an input disposed for receiving a word driver (WD) input signal, which is applied to address a row of cells in the array. The collector terminal of the transistor Q32 is coupled to a supply voltage $V_{CO}$, which is approximately zero volts. Line 31 is coupled to the collector terminal of a word driver current source transistor Q33. The base terminal of the transistor Q33 is coupled to a word driver current source reference voltage $V_{CS}$, which is typically -3.15 to 3.2 volts in one embodiment. The $V_{CS}$ signal is continuously supplied to the base terminal of the transistor Q33 while power is supplied to the device.

The emitter terminal of the transistor Q33 is coupled to a supply voltage $V_{EE}$ (which is approximately -4.5 volts) through a resistor R34. The collector terminal of the transistor Q33 is also coupled to the supply voltage $V_{CO}$ through an optional resistor R35. The resistor R35 is added to the circuit to provide an additional discharge path for shunting any charge stored on line 31 to the $V_{CO}$ voltage supply. Theoretically, resistor R35 helps effect a reset in a shorter period of time, but may be omitted to disconnect the discharge path between the collector of Q33 and $V_{CO}$, and the circuit will function properly. A reset bypass transistor Q36 is coupled in parallel with the series combination of transistor Q33 and resistor R35. In particular, the collector terminal of the transistor Q36 is coupled to the supply voltage $V_{CO}$, and the emitter terminal thereof is coupled to the emitter terminal of the transistor Q33. The base terminal of the transistor Q36 is coupled to line 37, which conveys an array RESET signal. The RESET signal swings in amplitude from approximatly -3.7 volts for no reset to approximately -2.7 volts for an array reset.

Bit lines 22 and 24 are coupled to sense amplifiers 40, which circuits are well known in the art; and, to transistors Q41 and Q42, respectively. In particular, bit line 22 is coupled to the collector terminal of transistor Q41, and the emitter terminal of Q41 is coupled to the $V_{EE}$ voltage source on lines during a terminal 43 through a resistor R44. In a similar manner, the emitter terminal of transistor Q42 is coupled to terminal 43 through a resistor R45. The base terminals of the transistors Q41 and Q42 are coupled to the reference supply voltage $V_{CS}$ on a terminal 45. Reset line 37 is also coupled to bit line (Y) address circuitry 46, which is generally indicated herein as part of sense amplifiers 40, to deselect all bit linesduring an array reset. Alternatively, the RESET signal can be applied to the array write circuitry (not shown) for deselecting the bit lines.

Additional memory cells 10b . . . 10n are shown coupled to word line 30 and current source line 31. Memory cells 10b . . . 10n are identical in construction to memory cell 10a. A pair of bit lines 48 and 49 are coupled to memory cell 10b, sense amplifiers 40, and to bit line current sources 50. Bit line current sources 50 comprise transistor circuitry (not shown) coupled in the same manner as transistors Q41 and Q42. Additional memory cells (not shown), which are identical in structure to memory cell 10a, are coupled in the array in the same manner as cells 10a, 10b, . . . 10n to complete the memory array. A separate word driver current source (similar to Q33) with a parallel coupled transistor (similar to Q36) is coupled to each word line of each row of cells in the memory array.

In operation, memory cells, such as cells 10a, 10b, . . . 10n are addressed by supplying a WD signal to the base terminal of the transistor Q32. In addition, the current source line 31 is activated by the $V_{CS}$ voltage applied to the base terminal of the transistor Q33. If, however, it is desired to reset all cells in the memory array to a given state, then a RESET signal is supplied to the base terminal of the transistor Q36. This interrupts the cell sustaining current supplied on the line 31. That is, the RESET pulse activates Q36 to divert the cell sustaining current for all cells coupled to a word line (e.g., word line 30) from the word driver current source (Q33 and R34), while simultaneously deselecting the sense amplifiers 40 by forcing the bit lines to a high voltage level.

The voltage on the collectors of transistors Q12 and Q14 go to a high level since the word line current source is shorted out by transistor Q36 being ON. When the RESET signal is removed from the base terminal of the transitor Q36 the current supply to the cells 10a, 10b, . . . 10n is returned, which will cause Q12 to turn ON and not Q14 due to the disparity in the size of the combined emitter 27,28 in comparison to the size of emitter 25. The combined emitter 27,28 operates at a lower current density than emitter 25 as a result of the larger size of emitter 27,28, thereby directing more current to the transistor Q12. Thus, the Q12 side of cell 10a has a higher voltage gain than the Q14 side at any given sustaining current. When the cell sustaining current is returned on line 31 following a RESET signal, the voltage gain of the Q12 side of cell 10a is higher than that of the Q14 side. This higher voltage gain will turn OFF transistor Q14 faster than Q14 can turn OFF transistor Q12. Open loop voltage gain will always approach one faster in the direction favoring the larger emitter device 12 as current to the cell is increased from zero toward some positive value.

Thus, when the open loop voltage gain of the cell 10a is equal to or greater than one, the cell will latch with transistor Q12 ON and Q14 OFF.

It should be pointed out at this juncture of the description that a SET or RESET state of the memory cell as representing a binary one or zero (or vice versa) depends upon which of the two bit lines is designated accordingly by the memory array designer. Though the term "RESET signal" has been used herein to describe the function of the signal supplied to the base terminal of Q36 as turning Q12 ON and Q14 OFF, it should be clear that this could also represent a SET state of the memory cell. It should also be clear that transistor Q14 could have the larger emitter and Q12 have the smaller emitter, thereby placing the cell in the opposite state following application of the "RESET signal." Likewise, memory cell 10a could be established in a SET state and other memory cells in the array established in a RESET state following application of the "RESET signal." This latter alternative, of course, can be implemented by fabricating some memory cells having a large emitter on one side of the bistable circuit, and other memory cells having the large emitter on the other side of the circuit. Accordingly, the memory array can established with a latent bit pattern following the application of a single signal designated herein as a "RESET signal."

Figure 2:
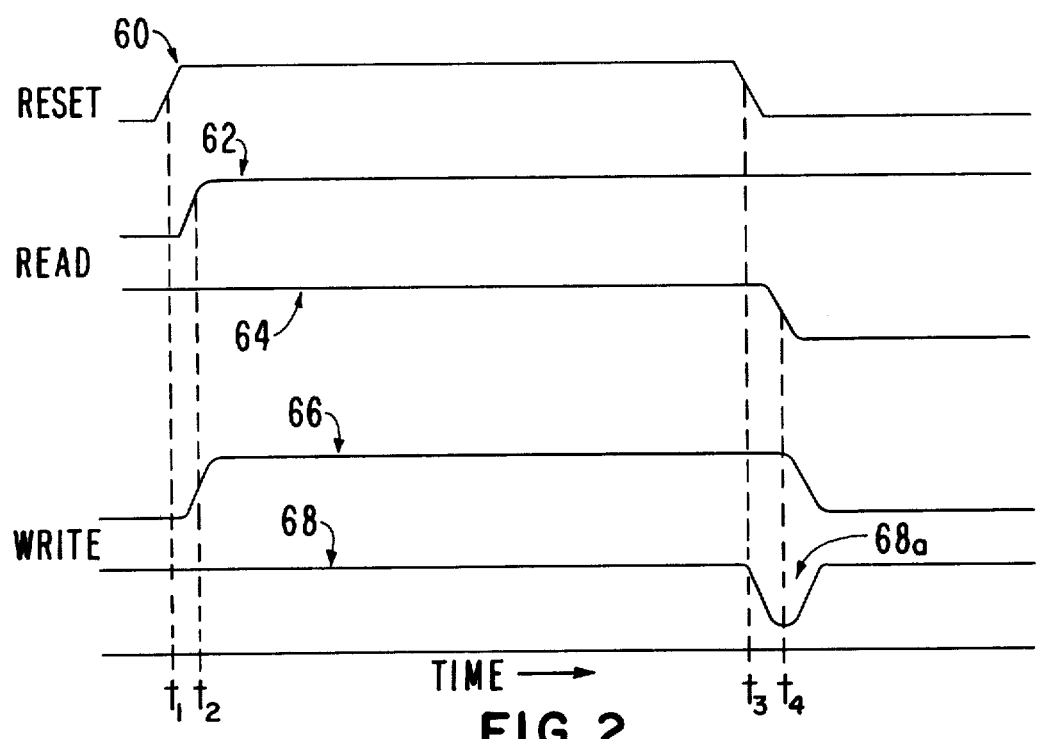
FIG. 2 is a timing diagram illustrating the operation of the memory cell of the present invention.

Referring now to FIG. 2, a timing diagram of the operation of the reset function of a memory cell in accordance with the present invention is shown. Waveform 60 illustrates the RESET signal supplied to the base terminal of the transistor Q36. Waveform 62 illustrates the voltage characteristics during a READ mode of operation on the collector terminal of Q14 during the presence of the RESET signal; and, waveform 64 illustrates the voltage on the collector of Q12 during the same time interval. The time delay between times $t_1$ and $t_2$ is approximately 4 to 5 nanoseconds, which time is a function of the power supplied to the cell and its associated capacitance. Note that between times $t_2$ and $t_3$ the voltage levels on the collectors of Q12 and Q14 are equal and at a high level. This, as stated hereinabove, is due to the loss of the cell sustaining current from transistor Q33 resulting from transistor Q36 being ON. Approximately 4 to 5 nanoseconds after the RESET pulse drops to a low level (times $t_3$ to $t_4$), the voltage level on the collector of Q12 drops to a low-level, while the voltage on the collector of Q14 remains at a high level.

It is also possible to reset the memory array during a WRITE mode of operation. That is, a RESET signal may be supplied on line 37 to the array while at the same time information is to be stored in or written into one or more cells of the array. As stated hereinabove, the bit lines are deselected during a reset operation; however, once the RESET signal drops to a low level the bit lines are again selected for transmitting information to the memory cells. Waveform 66 and 68 illustrate this operation, wherein waveform 66 illustrates the voltage characteristic during the WRITE mode of operation on the collector terminal of Q14 during the presence of the RESET signal; and, waveform 68 illustrates the voltage on the collector of Q12 during the same time interval. Note that at time $t_4$ the voltage on the collector of Q14 (waveform 66) drops to a low level in response to both the RESET signal (waveform 60) dropping to a low level and the writing of information into the cell. The voltage on the collector of Q12 drops momentarily to a low level (portion 68a of waveform 68) in response to the RESET signal dropping, and rises again in response to information being written into the memory cell.

Figure 3:
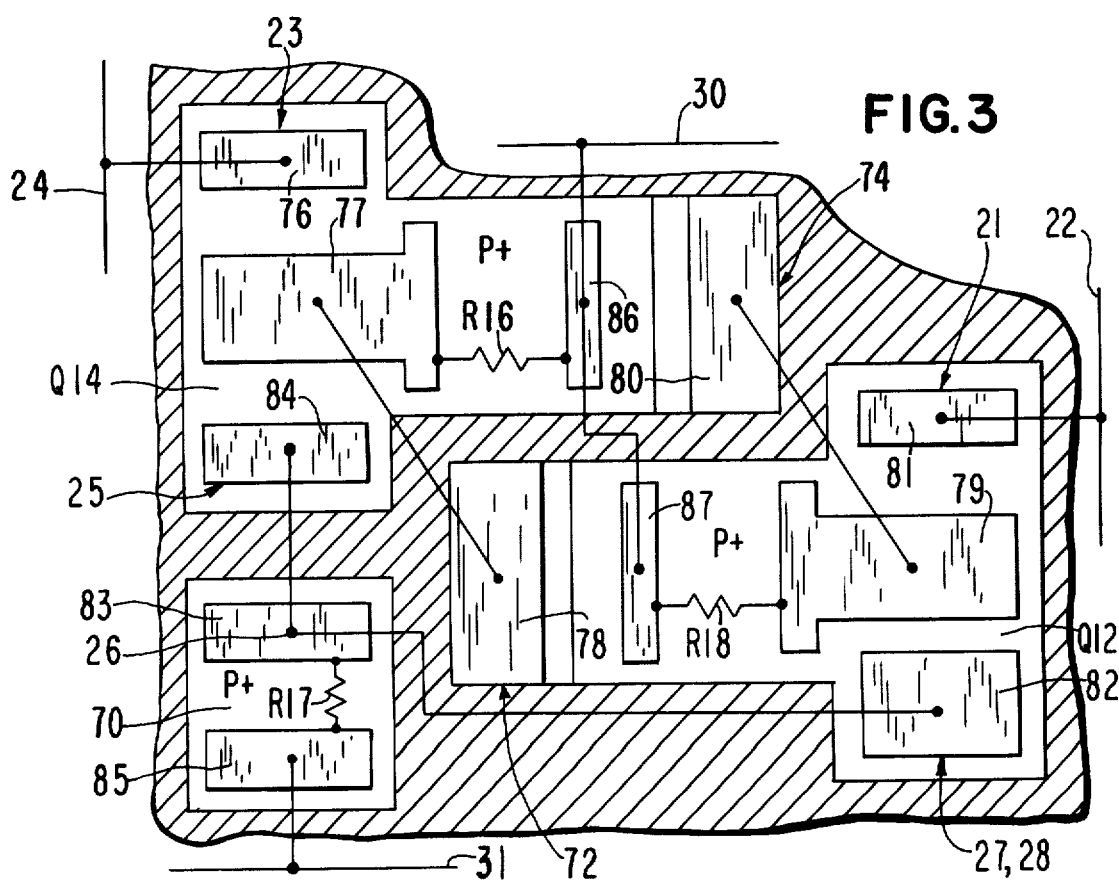
FIG. 3 is a planar view of an integrated embodiment of the memory cell of the present invention.

Referring now to FIG. 3, a planar view of an integrated embodiment of the memory cell 10a is illustrated. The starting material for fabrication of the memory cell is a substrate of P type semiconductor material. Next, a buried layer of N type semiconductor material if formed in the substrate, and an epitaxial layer of P type semiconductor material is formed over the substrate. An impurity is diffused into the epitaxial layer to form regions of P+ type semiconductor regions generally represented in FIG. 3 by reference numerals Q12, Q14 and 70. It is to be noted that semiconductor materials opposite to those described above may be employed to accomplished the same results as set forth herein. Like reference numerals are employed in FIG. 3 to indicate the same components illustrated in FIG. 1 and described hereinabove.

Emitter regions 23 and 25 are formed by diffusing an N+ type impurity into the P+ base region of transistor Q14. Likewise, emitter regions 21 and 27,28 are formed in the base region of the transistor Q12. Note that emitter region 27,28 is larger in size than the other emitter regions, and emitter region 25 in particular. The same result can be accomplished by diffusing two separate emitter regions for emitters 27 and 28, and electrically coupling these emitter regions together.

The regions thus formed are interconnected by conductive layers and separated by insulation layers as required, which technique is generally known in the semiconductor art. Accordingly, the drawing has been simplified by illustrating only the conductor contacts to the regions in the epitaxial layer, and the interconnections of these contacts are indicated. schematically.

Contact 76 to the emitter 23 of transistor Q14 is coupled to the bit line 24. Contact 77 to the base region of Q14 is connected to contact 78 for the collector region of Q12. Similarly, contact 79 to the base region of Q12 is connected to contact 80 for the collector region of Q14. Contact 81 to the emitter region 21 of Q12 is coupled to the bit line 22. Contact 82 to the emitter region 27,28 of Q12 is coupled to a contact 83 for the P+ region 70, wherein contact 83 forms the circuit point 26. The contact 83 is also coupled to a contact 84 for the emitter region 25 of the transistor Q14.

A second contact 85 to the P+ region 70 is coupled to the current source line 31. The P+ material of region 70 between contacts 83 and 85 forms the resistor R17, which is indicated schematically in FIG. 3 between contacts 83 and 85. A second contact 86 to the P+ base region of Q14 is coupled to the word driver line 30 and to a similar second contact 87 to the base region of Q12. The P+ material of the base regions of Q12 and Q14 between contact 86 and 77 of Q14 and 87 and 79 of Q12, form resistors R16 and R18, respectively. Resistors R16 and R18 are indicated schematically in FIG. 3 between contacts 86 and 77, and 87 and 79, respectively.

Portions of the surface of the epitaxial layer where no regions are formed, is covered with an insulating material, such as an oxide of the epitaxial material. This insulating layer is indicated in FIG. 3 by cross-hatching. It is noted, however, that additional insulating materials are employed to separate the conductors from the underlying semiconductor material, and to separate the conductors from one another. These latter insulating layers are not shown in the drawing for clarification purposes. It is also noted that other isolation techniques and materials may be employed to accomplish the same results.

An asymmetrical memory cell may also be fabricated to effect a higher voltage gain through the transistor Q12 side of the cell by making the resistor R16 larger in size than the resistor R18.

Yet another means for directing more current through one side of the cell bistable circuit than through the other side is to fabricate one transistor with a higher beta than the other transistor. Thus, when the cell sustaining current is returned following a RESET signal, the transistor having the larger beta will turn ON first thereby turning OFF the other transistor.

Figure 4:
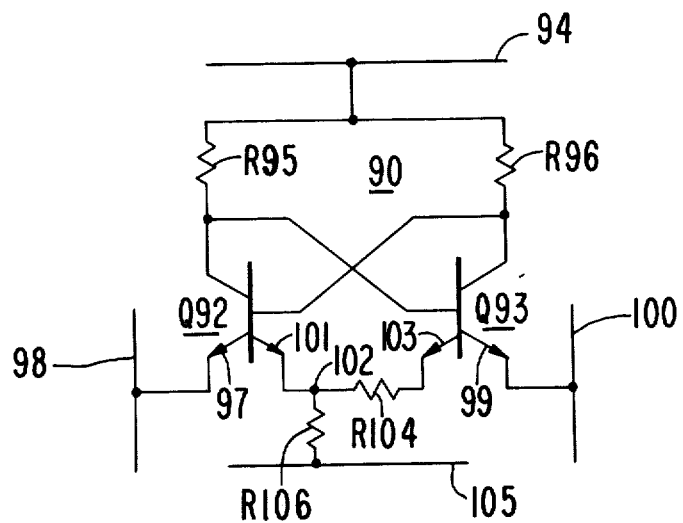
FIG. 4 is a schematic diagram of another embodiment of the present invention; and, FIG. 5 is a schematic diagram of still another embodiment of the present invention.

Referring now to FIG 4, another embodiment of a resettable memory cell 90 is illustrated. The memory cell 90 is formed from a cross-coupled pair of transistors Q92 and Q93. The base terminal of Q92 is coupled to the collector terminal of Q93, and the base terminal of Q93 is coupled to the collector terminal of Q92. The collector terminals of Q92 and Q93 are coupled to a word line 94 through a pair of resistors R95 and R96, respectively. A first emitter terminal 97 of Q92 is coupled to a bit line 98, and a first emitter terminal 99 of Q93 is coupled to a bit line 100. A second emitter terminal 101 of Q92 is coupled to a circuit point 102, and a second emitter terminal 103 of Q93 is coupled to the same circuit point 102 through a resistor R104. The circuit point 102 is coupled to a word driver current supply line 105 through a resistor R106.

The memory cell 90 is coupled into an array of memory cells in the same manner as described thereinabove for memory cell 10. The operation of memory cell 90 is substantially the same as described above, except that memory cell asymmetry is effected by resistor R104. When the cell sustaining current is returned on line 105 following a RESET signal, current will divide disproportionately at circuit point 102 as a function of the presence of resistor R104. The current through resistor R104 will cause the potential on the emitter 103 of Q93 to be more positive than the potential on emitter 101 of Q92, which will cause greater current to favor Q92. Thus, transistor Q92 will turn ON and transistor Q93 will turn OFF following a RESET signal.

Figure 5:
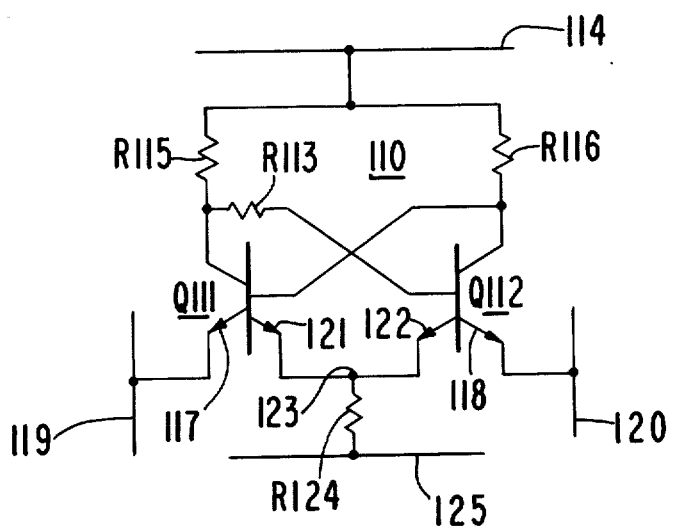

Referring now to FIG. 5, yet another embodiment of an asymmetrical memory cell 110 is illustrated. The memory cell 110 is also formed from a cross-coupled pair of transistors Q111 and Q112. The base terminal of Q111 is coupled to the collector terminal of Q112, and the base terminal of Q112 is coupled to the collctor terminal of Q111 through a resistor R113. The collector terminals of Q111 and Q112 are coupled to a word line 114 through a pair of resistors R115 and R116, respectively. A first emitter 117,118 of each of transistors Q111 and Q112, respectively, is coupled to a corresponding bit line 119 and 120. A second emitter 121,122 of each of transistors Q111 and Q112 is each coupled to a circuit point 123, and circuit point 123 is coupled to a word driver current supply line 124 through a resistor R125.

The operation of the memory cell 110 is substantially the same as that described above for memory cell 10, except that memory cell asymmetry is effected by the presence of resistor R113. That is, when the cell sustaining current is returned on line 105 following a RESET signal, current will divide disproportionately as a function of the presence of resistor R113. The base current of Q112 through R113 will cause the base potential of Q112 to be more negative than that of Q111. Thus, when the cell sustaining current is returned on line 125 following a RESET signal, transistor Q111 will turn ON and transistor Q112 will turn OFF.

It may be appreciated that a memory array having asymmetrical memory cells that can be established in a predetermined state has been shown and described hereinabove. Thus, while the invention has been particularly shown and described with reference to several preferred embodiments, it will be understood by those skilled in the art that the foregoing and other changes in form and details may be made therein without departing from the spirit and scope of the invention.

I claim:
1. A memory cell comprising:
  a. a word line;
  b. a current source line;
  c. a pair of bit lines;
  d. a first transistor having a base terminal, a collector terminal coupled to said word line, a first emitter coupled to a first of said pair of bit lines, and a second emitter coupled to said current source line;
  e. a second transistor having a base terminal coupled to said collector terminal of said first transistor, a a collector terminal coupled to said word line and to said base of said first transistor, a first emitter coupled to a second of said pair of bit lines, and a second emitter coupled to said current source line; and,
  f. means for directing more current through said second transistor than through said first transistor comprising said second emitter of said second transistor being larger than said second emitter of said first transistor.

2. A memory cell as in claim 1 further characterized by said second emitter of said second transistor comprising a pair of equal sized emitters.

3. An array of N × M memory cells as in claim 1, wherein N and M are integers each greater than one and representative of rows and columns, respectively, said array including N current source means each having a output coupled to said current source line in each row of cells in said array and an input being disposed for receiving a reset signal for said array.

4. An array as in claim 3 further including N current diverting means coupled in parallel with corresponding ones of said N current source means, each of said N current diverting means having an operating input disposed for receiving a RESET signal.

5. An array as in claim 4 further characterized by said current source means comprising an impedance means and a first transistor having a base terminal, a collector terminal coupled to a first side of said impedance means and to each of said memory cells in each one of said N rows of cells, and an emitter terminal.

6. An array as in claim 5 further characterized by said current diverting means comprising a second transistor having a base terminal coupled to said operating input, a collector terminal coupled to the second side of said impedance means, and an emitter terminal coupled to said emitter terminal of said first transistor, whereby current is diverted through said second transistor in lieu of through said first transistor in response to a RESET signal applied to said base terminal of said second transistor.

7. A semiconductor memory structure comprising:
  a. a semiconductor substrate of a first conductivity type;
  b. a pair of base regions formed in said substrate from a semiconductor material of the same conductivity type as, but of a higher concentration than, said substrate:
  c. a pair of collector regions being formed from a semiconductor material opposite to said base regions;
  d. a first pair of equal size emitter regions formed in a first of said pair of base regions, said first pair of emitter regions being formed from a semiconductor material opposite to said base regions; and,
  e. a second pair of emitter regions formed in a second of said pair of base regions, a first of said second pair of emitter regions being formed larger than the second of said second pair of emitter regions, said second pair of emitter regions being formed from a semiconductor material opposite to said base regions, such that information is written into and a latent bit pattern is simultaneously stored in the momory cell structure without the use of an externally generated and directed stimuli to distinguish between reading and writing modes of operation of the memory cell.

* * * * *